United States Patent
Toshio

(10) Patent No.: US 6,580,627 B2
(45) Date of Patent: Jun. 17, 2003

(54) VOLTAGE SENSING WITH HIGH AND LOW SIDE SIGNALS FOR DEADTIME COMPENSATION AND SHUTDOWN FOR SHORT CIRCUIT PROTECTION

(75) Inventor: Takahashi Toshio, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/996,975

(22) Filed: Nov. 30, 2001

(65) Prior Publication Data

US 2002/0105316 A1 Aug. 8, 2002

Related U.S. Application Data

(60) Provisional application No. 60/264,293, filed on Jan. 29, 2001.

(51) Int. Cl.[7] .................. H02M 3/24; H02M 7/5387
(52) U.S. Cl. .................................... 363/98; 363/132
(58) Field of Search ........................ 363/16, 17, 97, 363/98, 131, 132

(56) References Cited

U.S. PATENT DOCUMENTS

| 6,002,213 A | 12/1999 | Wood |
| 6,016,257 A | 1/2000 | Chang et al. |
| 6,185,118 B1 * | 2/2001 | Sander et al. ............. 363/132 |
| 6,222,751 B1 | 4/2001 | Portaluri et al. |
| 6,268,758 B1 * | 7/2001 | Limmer et al. ........... 327/424 |

* cited by examiner

Primary Examiner—Matthew Nguyen
(74) Attorney, Agent, or Firm—Ostrolenk, Faber, Gerb & Soffen, LLP

(57) ABSTRACT

A circuit for sensing the voltage across a power device, such as an insulated gate bipolar transistor (IGBT), that provides a power signal, such as to a motor. Where power devices are connected in a half bridge configuration, the sensing circuitry provides low side and high side sense signals. The signals indicate respectively when voltage changes across the low side and high side power devices. If on times of the devices are separated by deadtime, one sense signal can indicate the beginning of deadtime and the other can indicate the ending of the deadtime. The sensing circuitry can provide a sense result signal indicating whether voltage across the power device is greater than a reference voltage. The sense result signal can be received both by feedback signal circuitry that provides a signal indicating when voltage changes and also by shutdown circuitry that causes driving circuitry to turn off the power device if it is turned on when voltage across it is greater than the reference voltage, which occurs in a short circuit condition. The circuitry can be combined in an integrated circuit in which low side and high side sense signals are used both to provide voltage feedback signals and also to turn off the low or high side device if it is on when the voltage across it exceeds its reference voltage.

20 Claims, 8 Drawing Sheets

VOLTAGE SENSING WITH HIGH AND LOW SIDE SIGNALS FOR DEADTIME COMPENSATION AND SHUTDOWN FOR SHORT CIRCUIT PROTECTION

This application claims the benefit of U.S. Provisional Application Serial No. 60/264,293, filed Jan. 29, 2001.

BACKGROUND OF THE INVENTION

1. Field of the Invention

The present invention relates to sensing voltage across power devices that provide output power signals. More specifically, voltage feedback signals for high and low side power devices can improve deadtime compensation, such as for a pulse width modulated (PWM) motor. Also, a signal indicating voltage sensed across a device can be used both for voltage feedback and also to turn off the device to protect against a short circuit condition.

2. Brief Description of the Related Art

In PWM AC inverter-based motor drive systems, deadtime has been a problem. Deadtime is required in order to avoid cross conduction within an inverter leg of the power circuit. When the motor rotates at low speed, the PWM modulation index becomes small, resulting in significant pulse losses due to deadtime insertion between the high side and the low side switching devices.

In order to correct this voltage distortion, many deadtime compensation techniques have been proposed in the past. One technique measures the actual high voltage transition of the motor phase voltage and compares it against the commanded voltage. The error is then used to correct the voltage difference.

Many attempts have been made to measure the motor phase voltage in the PWM AC inverter drive circuit. One technique to sense the high voltage transition uses an optically isolated device. Another technique uses a high resistive divider circuit to sense the high voltage. U.S. Pat. No. 5,764,024, for example, shows a technique in which the output to the motor is connected directly to a voltage sensor that senses when a voltage passes a threshold and provides a digital output signal in response. These traditional techniques, however, suffer from an inaccuracy problem stemming from the inevitable time delay associated with component variation and parasitic circuitry.

When implemented by optically isolated devices, variation of transfer delay among each optically isolated device is large and normally exceeds an order of microseconds. Given the present day PWM pulse resolution of 50 nanoseconds, this represents an unacceptable accuracy range.

When implemented by using a resistor divider network, the signal delay is also unacceptable. This delay is largely due to the fact that the parasitic capacitance combined with the high value of the resistor divider circuit forms a relatively large time constant filter which can be on the order of microseconds. (For example, 1 megaohm resistance combined with 5 pF parasitic capacitance forms a 5 microsecond time constant.)

The inaccuracy problem is further pronounced when the motor current reaches near zero as can be understood from FIGS. 1A–1D. FIG. 1A shows a conventional half bridge circuit 10, which can form one leg of a PWM AC inverter circuit. High side transistor (Q1) 12 and low side transistor (Q2) 14 are insulated gate bipolar transistors (IGBTs). The gate lead of transistor 12 receives drive signal HO, while the gate lead of transistor 14 receives drive signal LO. Output node 20, connected at the midpoint between transistor 12 and transistor 14, provides output voltage Vm to motor 22. Motor current Ia is defined as the current that flows from node 20 to motor 22. High side diode (D1) 30 and low side diode (D2) 32 permit current flow across transistor 12 and transistor 14, respectively.

The waveforms in FIGS. 1B and 1C illustrate operation of circuit 10 when a large current is flowing from output node 20 to motor 22 (Ia>0), shown as case 1 in FIG. 1B, and when a large current is flowing from motor 22 to output node 20 (Ia<0), shown as case 2 in FIG. 1C. In other words, two different cases of phase voltage switching occur at node 20, depending on the direction of motor current Ia. In both FIGS. 1B and 1C, the uppermost waveform is a PWM voltage command signal received by control circuitry, which responds by providing high side drive signal HO and low side drive signal LO with deadtime inserted for a predetermined time period, shown in the second and third waveforms in FIGS. 1B and 1C respectively.

In case 1, when the motor phase current Ia is positive, the output drive voltage Vm, shown in the fourth waveform in FIG. 1B, is biased to DC(−) from t0 to t1 and from t1 to t2. During this period, current is only able to flow from the DC(−) bus through diode 32 to node 20 (and hence to motor 22) because transistor 12 is turned off from t0 to t2. HO goes high at t2, turning on transistor 12 and allowing current to flow from the DC(+) bus to node 20 so that Vm is immediately biased to DC(+). Then, when HO goes low at t3, turning off transistor 12, current again begins to flow through from the DC(−) bus through diode 32 to node 20 and Vm is again biased to DC(−). Therefore, in case 1, Vm is completely determined by HO switching.

In case 2, when the motor phase current Ia is negative, the output drive voltage Vm is biased to DC(−) from t0 to t1. This is because LO is high, turning on transistor 14 and allowing current to flow from motor 22 through transistor 14 to the DC(−) bus. At t1, LO goes LO, turning off transistor 14 so that current is only able to flow from motor 22 through diode 30 to the DC(+) bus. Therefore, Vm quickly changes bias to DC(+) at t1. At t2 and t3, current continues to flow through diode 30 even when transistor 12 turns on or off, because diode 30 is the only current path from node 20 to either DC bus. At t4, LO goes high and turns on transistor 14, allowing current to flow from node 20 through transistor 14 to the DC(+) bus. Vm accordingly changes bias to DC(−) at t4. Therefore, in case 2, Vm is completely determined by LO switching.

In general, when motor current Ia is distinctively positive or negative, as in cases 1 and 2, the output drive voltage Vm follows either HO or LO, respectively. When motor current Ia is near zero, however, the output drive voltage Vm does not simply follow either HO or LO.

During a near zero current (Ia≈0) between node 20 and motor 22, illustrated in FIG. 1D, Vm can begin rising from its low value at t1 with a high initial positive slope, as illustrated by segment 40, and then can rise at a lower slope, as illustrated by segment 42, finally rising again at a high positive slope beginning at approximately t2 until it reaches its high value, as illustrated by segment 44. Vm can remain at its high value until t3, as illustrated by segment 46, after which it can decrease at a high initial negative slope, as illustrated by segment 50, and then can decrease at a lower slope, as illustrated by segment 52, finally decreasing again at a high negative slope until it reaches its low value at approximately t4, as illustrated by segment 54.

FIG. 1D therefore shows that the actual phase voltage transition becomes nonlinear and makes non-smooth transitions during deadtime inserted between t1 and t2 and between t3 and t4. This occurs because the inverter leg circuit shown in FIG. 1A appears essentially as a high impedance during deadtime intervals with a near zero motor current. Voltage potential at segment 42 and 52 is determined by Counter Electromotive Force (CEMF) or Back Electromotive Force (Back EMF) at moment of deadtime. In this condition, it might be possible to track the voltage transition more accurately using multiple outputs during the voltage transition or an accurate analog output. So far, however, no known technique has successfully overcome the inaccuracy problem.

SUMMARY OF THE INVENTION

The present invention provides new voltage sensing techniques. The new techniques can be used, for example, to sense motor phase voltage in a PWM AC inverter circuit.

One of the new techniques provides voltage feedback for both low and high side power devices, such as power transistors connected in a half bridge. This new technique can be implemented in a circuit in which sensing circuitry senses voltage changes across the low and high side power devices and provides low and high side sense signals indicating respectively when voltage changes across the low and high side power devices.

The new techniques therefore make it possible to alleviate the inaccuracy problem described above by providing information about both power devices. For example, if the on times of the power devices are separated by deadtime as described above, one of the low and high side sense signals can indicate a beginning of the deadtime and the other can indicate an ending. As a result, deadtime compensation can be performed more accurately.

The new voltage feedback circuit can also include feedback signal circuitry that provides first and second feedback signals obtained from the low and high side sense signals. The feedback signal circuitry can include level shifting circuitry to shift one of the sense signals so that the first and second feedback signals are in approximately the same range. For example, the high side sense signal can be shifted downward.

The new voltage feedback circuit can be included in an integrated circuit that has appropriate pins. For example, the first and second feedback signals can be provided by low and high side feedback output pins. Or the sensing circuitry can include both low and high side sensing circuitry, each with a sense input pin to receive a sense input signal with information about voltage across its power device; for example, the sense input signal can indicate voltage at the device's power supply lead. Each side's sensing circuitry can also include a comparator with one input receiving the sense input signal and the other receiving a reference voltage relative to the device's ground lead; the comparator's result signal can thus include a transition between low and high values when voltage changes across the respective power device.

Another new voltage sensing technique combines sensing for voltage feedback with sensing for shutdown, such as to prevent damage due to a short circuit. This technique can be implemented in a power control circuit that includes driving circuitry providing output drive signals to the gate lead of a power device and sensing circuitry that provides a sense result signal indicating whether voltage across the power device is greater than a reference voltage. The circuit can also include both feedback signal circuitry and shutdown circuitry. The feedback signal circuitry can receive the sense result signal and, in response, can provide a voltage feedback signal indicating when voltage changes across the power device. The shutdown circuitry can also receive the sense result signal and can cause the driving circuitry to turn off the power device if it detects an abnormal overcurrent condition. For example, the shutdown circuitry can detect an abnormal overcurrent if the power device is turned on when the sense result signal indicates that voltage across the power device is greater than the reference voltage.

The new power control circuit can also be implemented in an integrated circuit that has appropriate pins. For example, a sense input pin can receive a sense input signal indicating voltage at the power device's power supply lead, and the sensing circuitry can include a comparator with first and second inputs connected as described above. The driving circuitry can include a driver that provides the output drive signals in response to the shutdown circuitry and in response to an input drive signal indicating whether to turn on or off the power device. More specifically, the driver can provide the output drive signals in accordance with the input drive signal except when the shutdown circuitry causes the driver to turn off the power device. The driving circuitry can also include a driver output pin for connecting to provide the output drive signals to the power device's gate lead.

The two new voltage sensing techniques described above can be used together to provide an especially elegant circuit. For example, driving circuitry, sensing circuitry, shutdown circuitry, and feedback signal circuitry as described above can provide signals for both the low and high side power devices. Where appropriate, separate circuitry can be provided on the low and high sides.

The power devices can be transistors, such as insulated gate bipolar transistors (IGBTs), connected in a half bridge with a power output node connected to the power supply lead of the low side power device and the ground lead of the high side power device. The power output node can also be connected to provide the output power signal to a motor, and each input drive signal can be derived from a pulse width modulated drive signal and can be received on the low and high sides by respective driver input pins. The high side driving circuitry can also include upward level shifting circuitry that shifts the high side input drive signal to a high side voltage range.

Other features and advantages of the present invention will become apparent from the following description of the invention which refers to the accompanying drawings.

DETAILED DESCRIPTION OF THE PREFERRED EMBODIMENTS

Figure 1A:
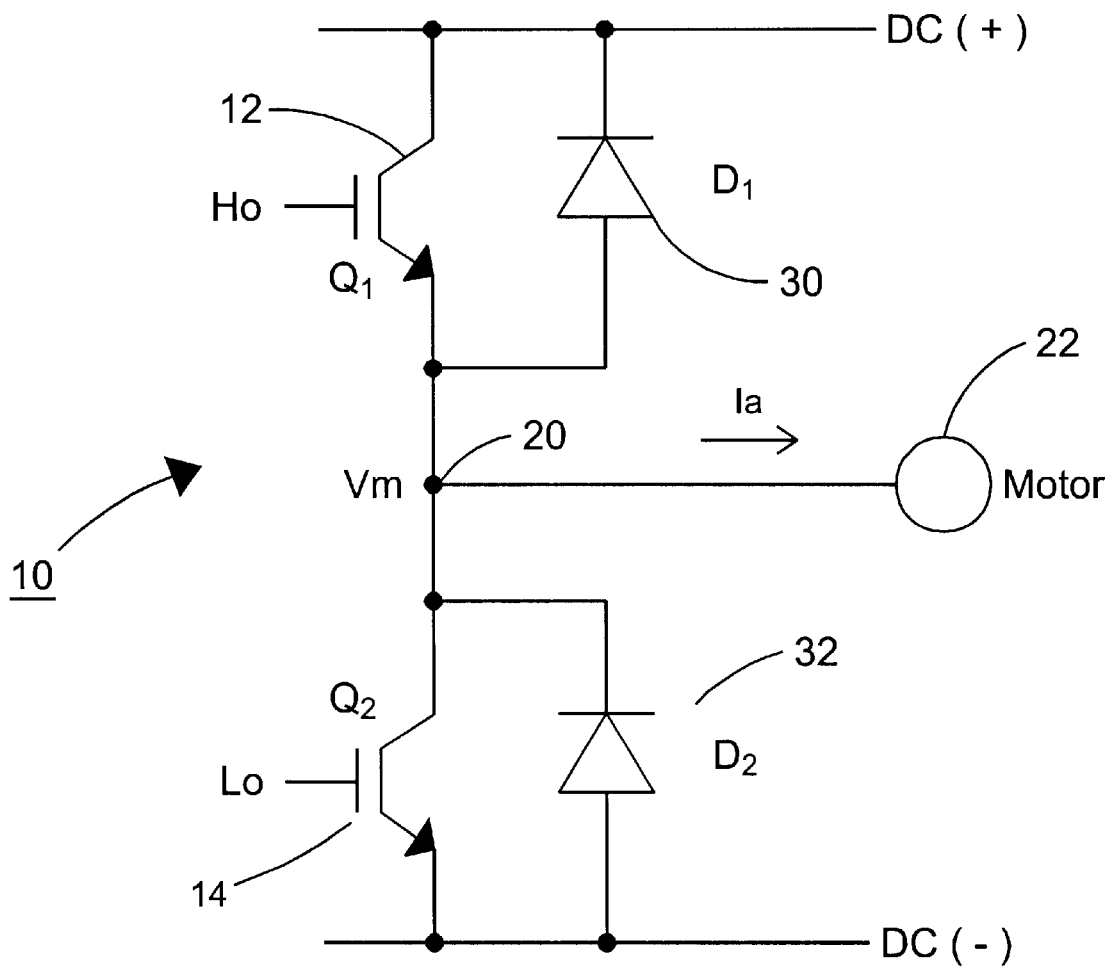
FIG. 1A is a schematic circuit diagram of a conventional half-bridge for driving a motor.
Figure 1B:
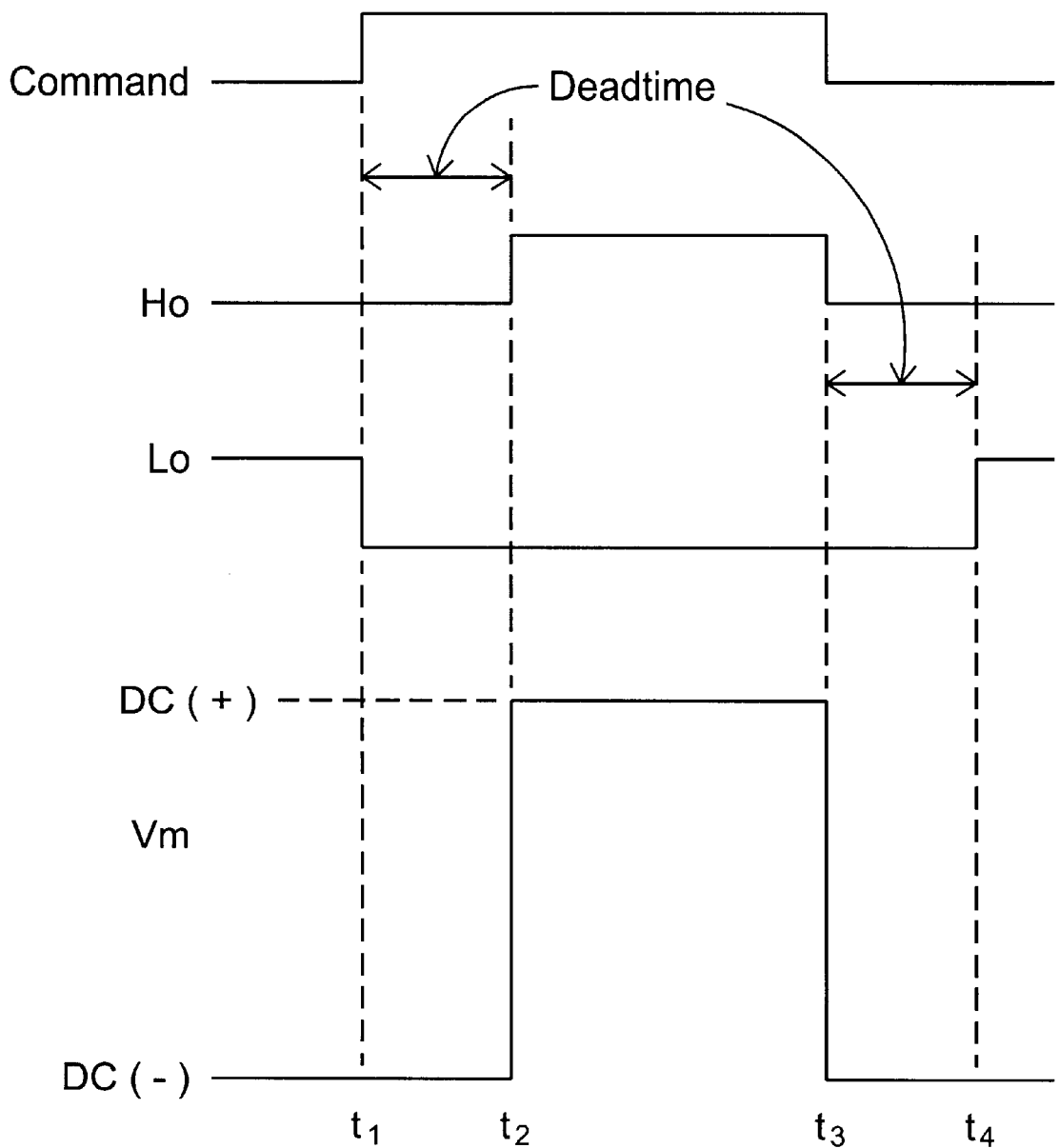
FIGS. 1B and 1C show waveforms in the circuit of FIG. 1A during positive and negative motor currents, respectively.
Figure 1C:
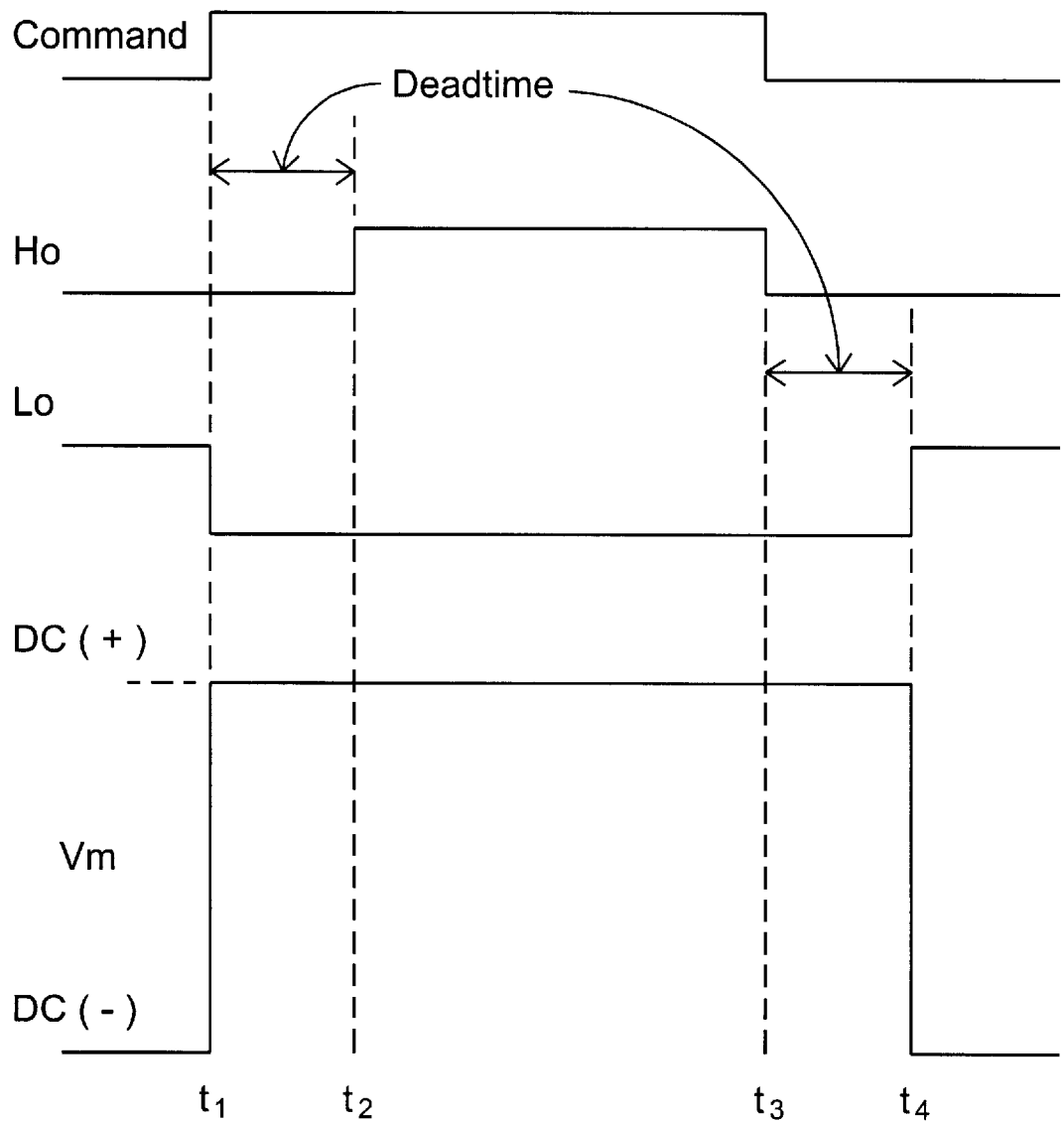
Figure 1D:
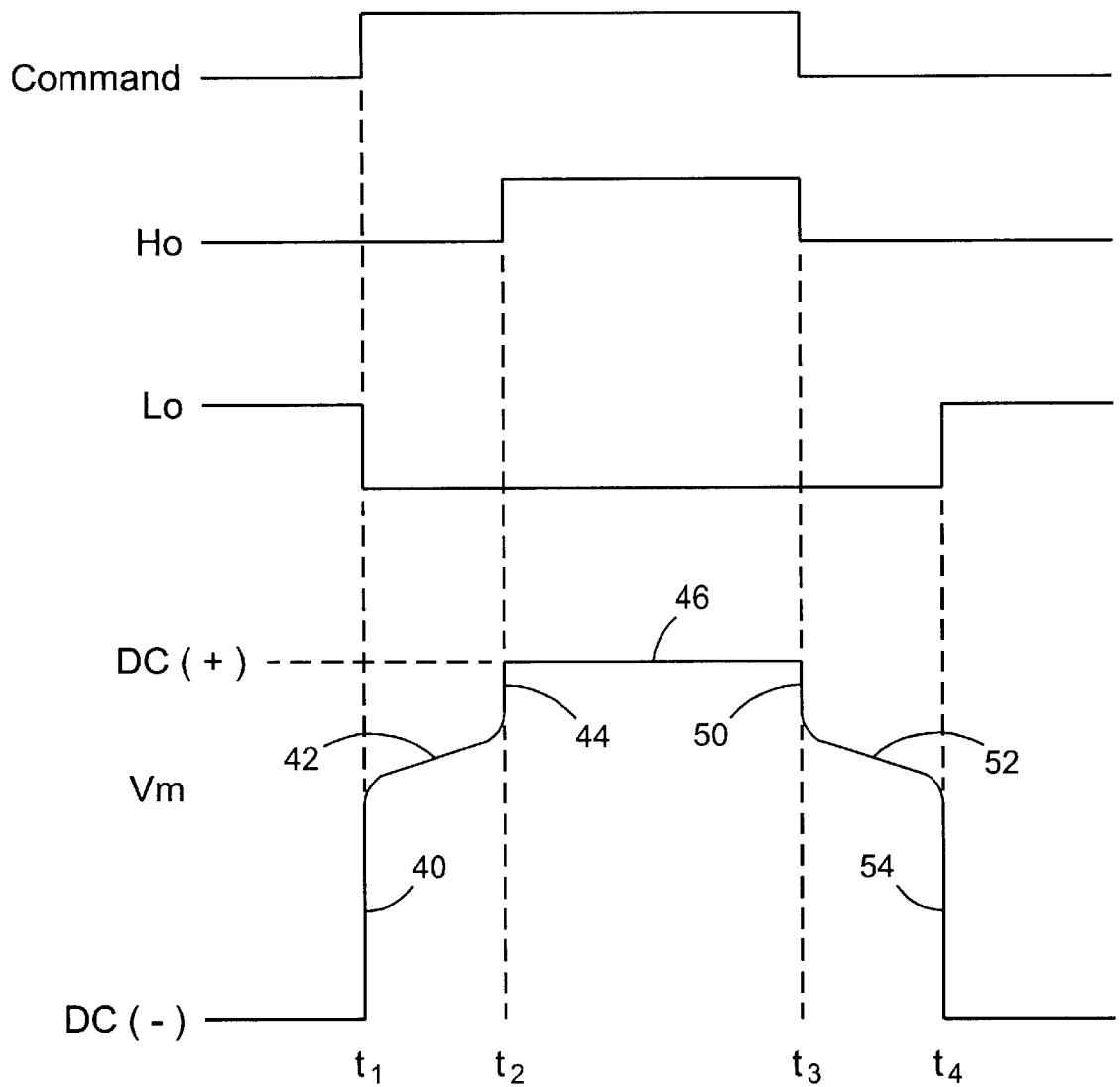
FIG. 1D shows waveforms in the circuit of FIG. 1A during near zero motor currents.
Figure 2:
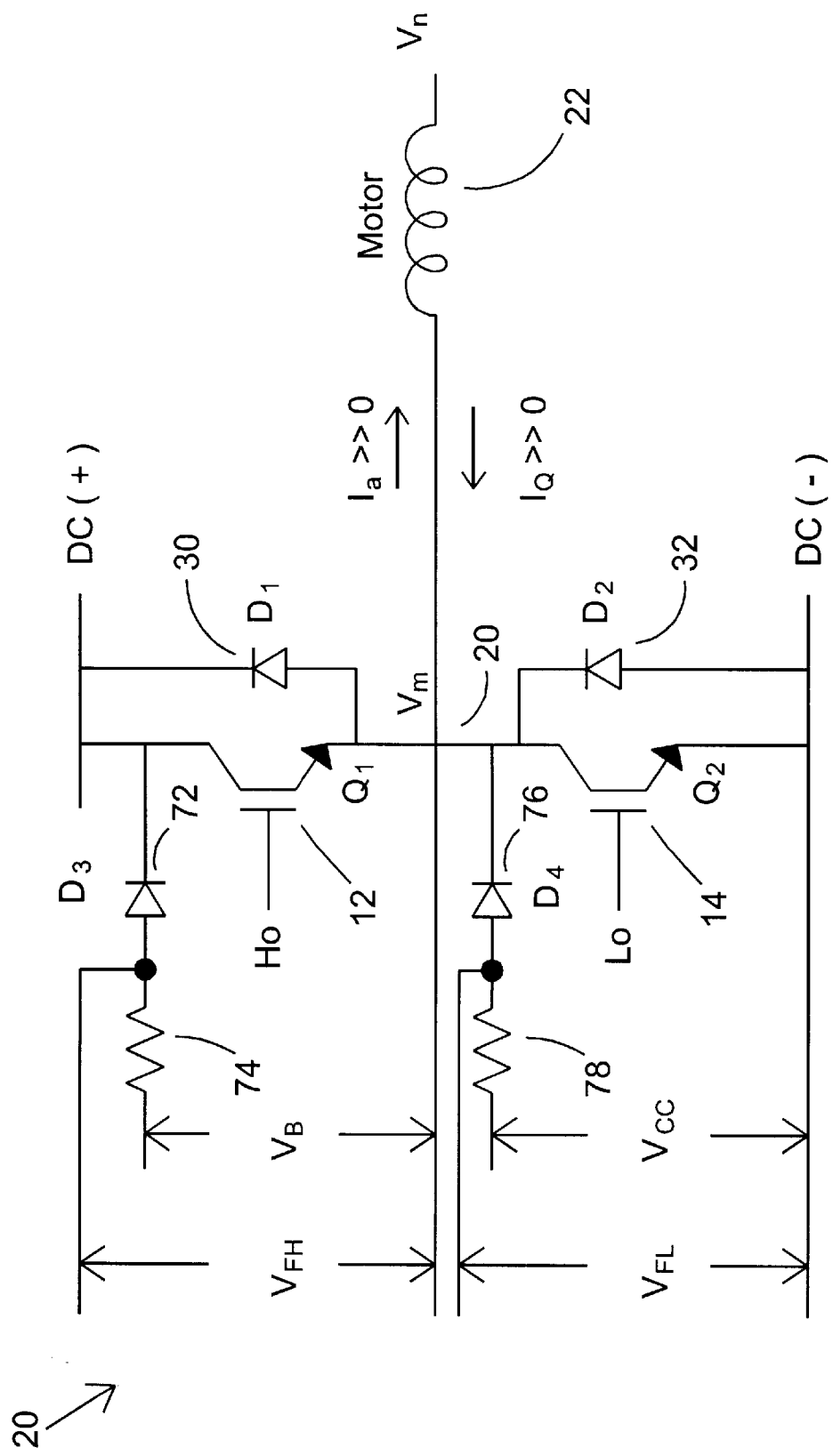
FIG. 2 is a schematic circuit diagram of a half-bridge with sensing circuitry indicating voltage across drive transistors and also overcurrent conditions.
Figure 3:
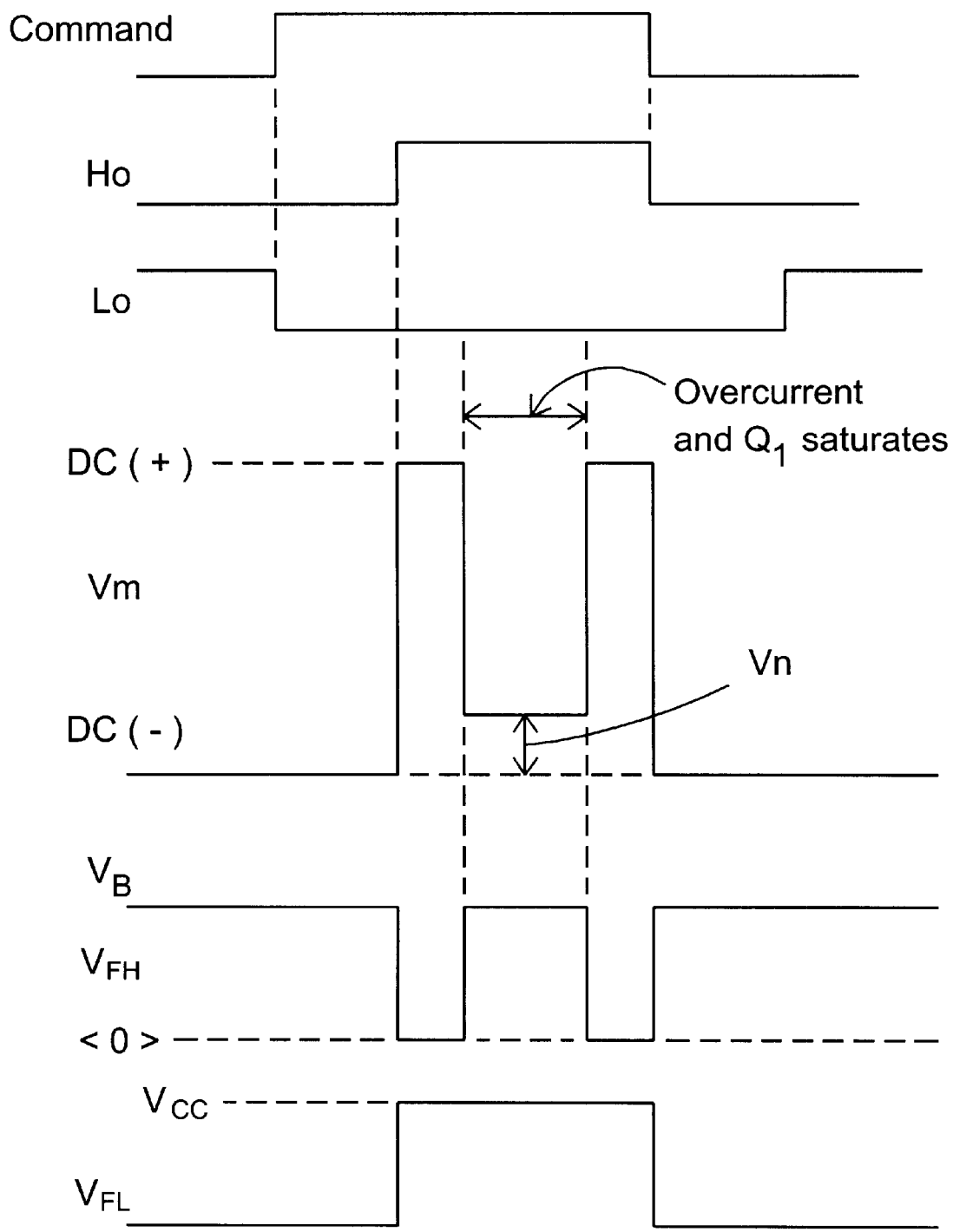
FIG. 3 shows waveforms in the circuit of FIG. 2 during a large positive overcurrent condition.
Figure 4:
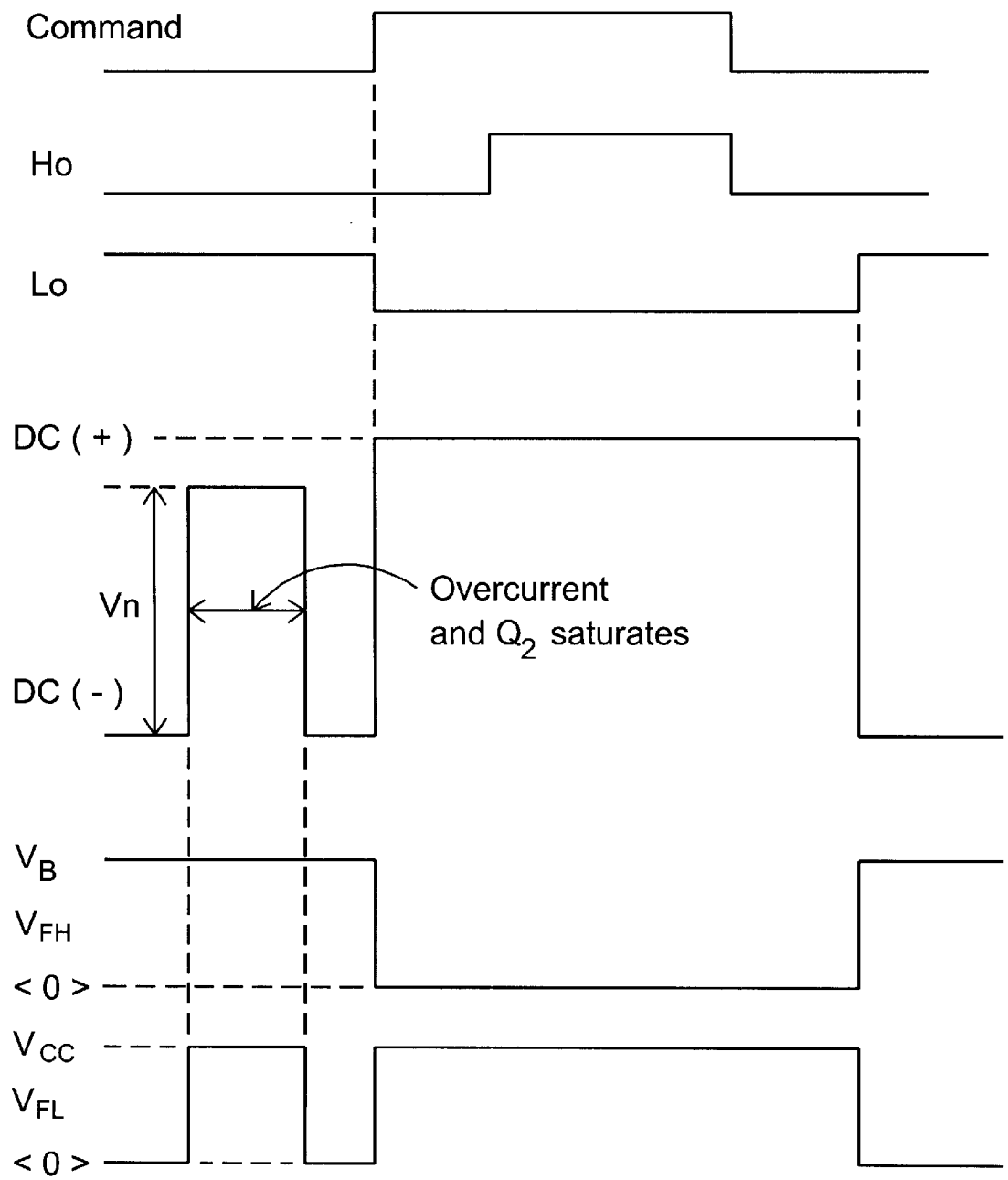
FIG. 4 shows waveforms in the circuit of FIG. 2 during a large negative overcurrent condition.

FIG. 2 shows circuit 70 in which components equivalent to those in FIG. 1A have the same reference numerals. In addition, circuit 70 combines sensing for voltage feedback with sensing for shutdown. Specifically, the high side circuitry includes voltage sensing diode (D3) 72 and resistance 74, while the low side circuitry includes voltage sensing diode (D4) 76 and resistance 78. FIGS. 3 and 4 show waveforms that occur in circuit 70 during large positive and negative overcurrent conditions, respectively, illustrating how circuit 70 provides information not only about voltage but also about abnormal overcurrent conditions.

In FIG. 3, when excess current flows from node 20 to motor 22 (Ia>>0) while transistor 12 is on, the voltage across the collector and emitter of transistor 12 saturates and Vm approximates DC(−) and also Vn, the voltage on the opposite side of motor 22. VFH, the voltage across the anode of sensing diode 72 and transistor 12, is at approximately zero while Vm is at DC(+); during the excess current flow, VFH rises to VB, the voltage across resistance 74, diode 72, and transistor 12, where VB is also the reference bias voltage for the HO driver circuit. Therefore, if HO is high and VFH is also high, i.e. at VB, an abnormal positive overcurrent condition exists for transistor 12.

In FIG. 4, when excess current flows from motor 22 to node 20 (Ia<<0) while transistor 14 is on, the voltage across the collector and emitter of transistor 14 saturates and Vm approximates DC(+) and also Vn. VFL, the voltage across the anode of sensing diode 76 and transistor 14, is at approximately zero while Vm is at DC(−); during the excess current flow, VFL rises to Vcc, the voltage across resistance 78, diode 76, and transistor 14, where Vcc is also the reference bias voltage for the LO driver circuit. Therefore, if LO is high and VFL is also high, i.e. at Vcc, an abnormal negative overcurrent condition exists for transistor 14.

Figure 5:
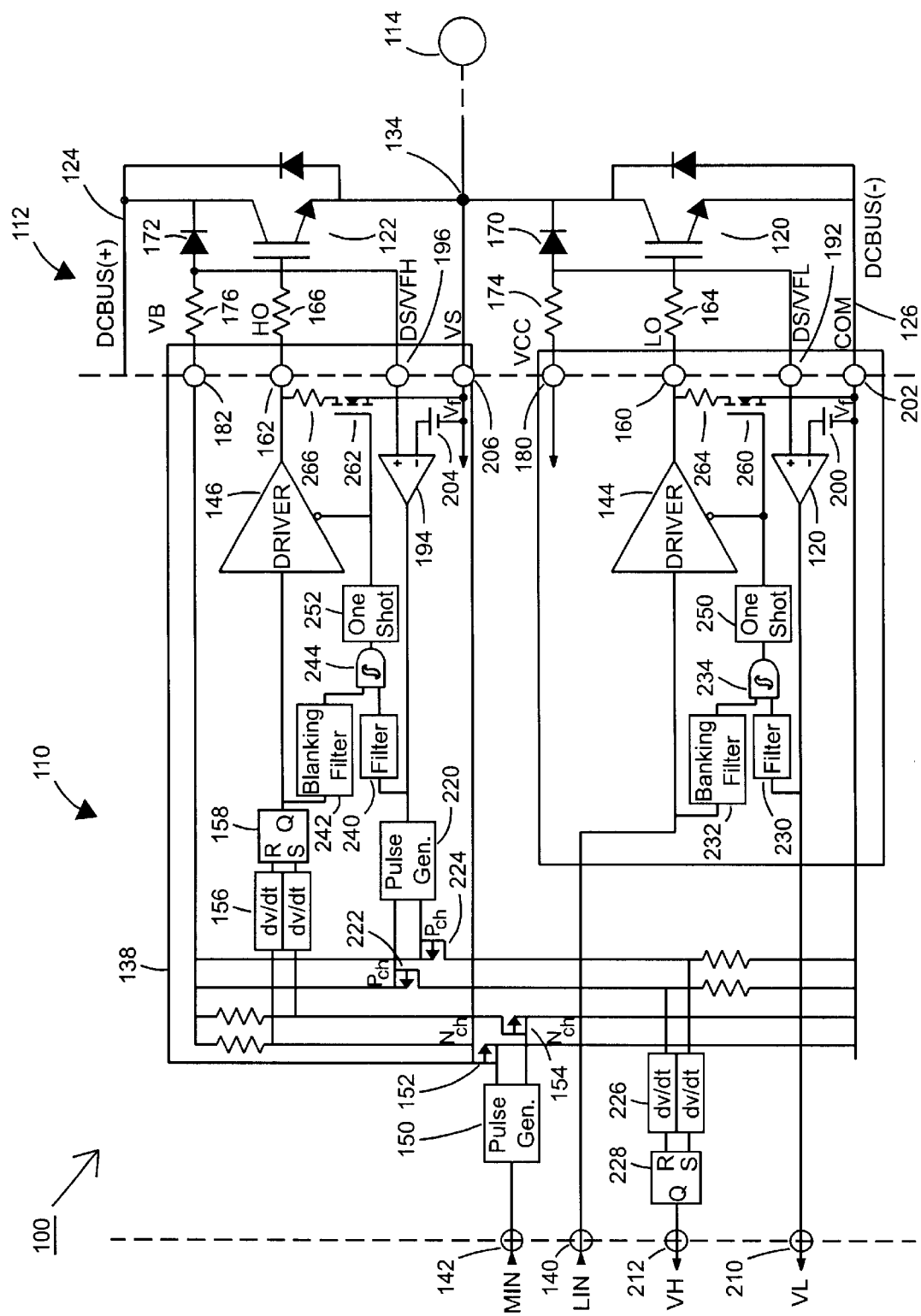
FIG. 5 is a schematic circuit diagram that includes sensing circuitry as in FIG. 2.

FIG. 5 shows circuit 100, which includes components of integrated circuit (IC) 110 mounted on board 112 and other components that can also be mounted on board 112, including sensing circuitry as in FIG. 2. Circuit 100 illustrates one of many possible implementations of the invention.

The components on board 112 illustratively form one leg of a circuit for driving motor 114, and other legs could be implemented in the same way. The invention could, however, be used in various other applications.

Low and high side power devices, illustratively IGBTs 120 and 122, are connected in a half bridge circuit between DC buses 124 and 126. Rather than an IGBT, each power device could be another power switching transistor or any other appropriate device. The ground lead of IGBT 122 and the power supply lead of IGBT 120 are connected at node 134 to provide an output power signal that depends on voltages across IGBTs 120 and 122. Low side circuitry 136 performs driving and sensing functions relating to low side IGBT 120, while floating high side circuitry 138 performs driving and sensing functions relating to high side IGBT 122.

A microprocessor or other appropriate controller (not shown) receives a PWM signal as in the upper waveform in FIG. 1A and responds by providing input drive signals to low side input (LIN) pin 140 and high side input (HIN) pin 142 on IC 110. The LIN signal is provided directly to low side driver 144, while the HIN signal is level shifted upward before being provided to high side driver 146. The level shift up circuitry includes pulse generator 150, rising and falling edge n-channel level shifters 152 and 154, dv/dt filters 156, and R-S flip-flop 158. The output drive signals from drivers 144 and 146 are provided to the gate leads of IBGTs 120 and 122 through low side output drive (LO) pin 160 and high side output drive (HO) pin 162 and resistances 164 and 166, respectively. Illustrative signals on HO and LO are shown in the second and third waveforms in FIG. 1A. The above components thus function together as driving circuitry, providing low and high side output drive signals for the gate leads of the low and high side power devices, respectively.

Low side sensing diode 170 and high side sensing diode 172 are both high voltage diodes that serve as voltage sensing diodes in the manner described in U.S. Pat. No. 5,444,591, incorporated herein by reference. Diode 170 is connected in series with resistance 174 between the power supply lead of IGBT 120 and its power supply (VCC) pin 180. Similarly, diode 172 is connected in series with resistance 176 between the power supply lead of IGBT 122 and its power supply (VB) pin 182. The voltage between diode 170 and resistance 174 is provided to the "+" input of low side comparator 190 through sense input (DS/VFH) pin 192, and the voltage between diode 172 and resistance 176 is similarly provided to the "+" input of high side comparator 194 through sense input (DS/VFH) pin 196. The "−" input of comparator 190 receives reference voltage Vf relative to DC bus 126 from voltage source 200 and ground (COM) pin 202, and the "−" input of comparator 194 similarly receives reference voltage Vf relative to node 134 from voltage source 204 and ground (VS) pin 206. VB and VS thus serve as the power supply and ground pins of floating high side circuitry 138, while VCC and COM serve as the power supply and ground pins of low side circuitry 136. Also, the above components function as sensing circuitry, sensing voltage changes across IGBTs 120 and 122. Specifically, comparators 200 and 204 provide low and high side sense signals indicating respectively whether voltage across the low or high side power device, IGBT 120 or IGBT 122, is greater than a respective reference voltage, illustratively the same voltage Vf though the reference voltages could differ. Sensing circuitry could also be implemented in various other ways.

The low side sense signal from the output of comparator 190 is provided to a microprocessor or other appropriate controller (not shown) through low side voltage feedback (VL) pin 210. The high side sense signal from the output of comparator 194, however, is level shifted down before being provided to the controller through high side voltage feedback (VH) pin 212 in approximately the same voltage range as the VL signal. The level shift down circuitry includes pulse generator 220, rising and falling edge p-channel level shifters 222 and 224, dv/dt filters 226, and R-S flip-flop 228. The above components therefore function as feedback signal circuitry that receives the low and high side sense signals and, in response, provides voltage feedback signals indicating when voltages change across the low and high side power devices, IGBT 120 and IGBT 122.

The low side sense signal from the output of comparator 190 is also provided to filter 230, while the LIN signal is provided to blanking filter 232 for comparison of the filter outputs by AND gate 234, which has hysteresis. Similarly, the high side sense signal from the output of comparator 194 is provided to filter 240, while the HIN signal is provided to blanking filter 242 for comparison of the filter outputs by AND gate 244, which similarly has hysteresis. High outputs from AND gates 234 and 244 therefore indicate that one of IGBTs 120 and 122 is turned on at the same time that voltage across it exceeds reference voltage Vf, thus indicating that a short circuit condition exists. In response to the high output, four-microsecond one shot element 250 or 252 causes respective driver 144 or driver 146 to provide an output drive signal that turns off the respective one of IGBTs 120 and 122. At the same time, transistors 260 and 262 are activated and start sinking gate current slowly through series resistors 264 and 266, respectively, for four microseconds. In other words, the driving circuitry performs a local soft shutdown in the event of a short circuit condition. The above components therefore function as shutdown circuitry, receiving the low and high side sense signals and causing the driving circuitry to turn off the low or high side power device, IGBT 120 or 122, if it is turned on when its sense result signal indicates that voltage across it is greater than the reference voltage.

As shown in FIGS. 3 and 4, during operation of circuit 100, the voltage potential to the motor (the voltage Vm on pin VS) switches between its low value, the voltage DCBUS (−) on bus 126, and its high value, the voltage DCBUS(+) on line 124. This switching results from operation of IGBTs 120 and 122.

When Vm starts a transition from DCBUS(−) toward DCBUS(+), the input at the DS/VFL pin is compared against reference voltage Vf by comparator 190. As Vm increases, the signal VL provided to output pin 210 by comparator 190 switches from low to high when Vm exceeds [DCBUS(−)+Vf]. As Vm continues to increase and reaches [DCBUS(+)−Vf], the output from comparator 194 makes a transition from low to high. This transition produces a SET pulse to p-channel level shifter 224 through pulse generator 220. After downward level shifting, the signal is transferred to RS flip flop 228 via one of dv/dt filters 226, and finally changes the signal VH on output pin 212 from low to high.

When Vm changes from DCBUS(+) toward DCBUS(−), these actions take place in reverse. First the VH output changes from high to low when Vm reaches [DCBUS(+)−Vf]. In this transition, pulse generator 220 provides a RESET pulse to p-channel level shifter 222. After downward level shifting, the signal is again transferred to RS flip flop 228 via one of dv/dt filters 226, and finally changes the signal VH on output pin 212 from high to low. Then, the VL output changes from high to low when Vm reaches [DCBUS(−)+Vf].

The two digital signal outputs, VH and VL, can be used by a controller to accurately derive the volt-second to the motor. For example, the trapezoidal volt-second area can be calculated by counting the "on" duration period of VH and VL using fast counters.

The level shifter approach of measuring the motor phase voltage, which can be implemented as shown in FIG. 5, has advantages over prior art methods. Accuracy of the matching delay between VH and VL propagation delays can be easily adjusted since the circuitry shown in FIG. 5, including driving circuitry and sensing circuitry (but excluding IGBTs 120 and 122, diodes 130, 132, 170, and 172, and appropriate resistances 164, 166, 174, and 176), can be implemented as a monolithic integrated circuit such as IC 110.

Shutdown circuitry could be implemented in many ways other than that shown in FIG. 5. Additional examples are disclosed in U.S. patent application Ser. No. 09/966,091 of Grasso et al., filed Oct. 1, 2001, the disclosure of which is incorporated herein by reference.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A voltage feedback circuit for low side and high side power devices arranged in a half-bridge configuration for providing an output power signal, the output power signal depending on voltages across the low and high side power devices, the voltage feedback circuit comprising:
   sensing circuitry that senses voltage changes across the low and high side power devices; the sensing circuitry providing low and high side sense signals, the low side sense signal indicating when voltage changes across the low side power device and the high side sense signal indicating when voltage changes across the high side power device.

2. The circuit of claim 1 in which the low and high side power devices are separately turned on and off to control the voltages thereacross, wherein on times of the low and high side power devices are separated by a deadtime that begins when one of the devices is turned off and ends when the other is turned on, and wherein one of the low and high side sense signals indicates a beginning of the deadtime and the other indicates an ending of the deadtime.

3. An integrated circuit that includes the voltage feedback circuit of claim 1, wherein the sensing circuitry includes:
   low side sensing circuitry for providing the low side sense signal; and
   high side sensing circuitry for providing the high side sense signal;
   the low and high side sensing circuitry including low and high side sense input pins, respectively, for receiving sense input signals from the low and high side power devices, respectively, each sense input signal including information about voltage across the respective power device.

4. An integrated circuit that includes a voltage feedback circuit for low side and high side power devices arranged in a half-bridge configuration for providing an output power signal, the output power signal depending on voltages across the low and high side power devices, the voltage feedback circuit comprising:
   sensing circuitry that senses voltage changes across the low and high side power devices; the sensing circuitry providing low and high side sense signals, the low side sense signal indicating when voltage changes across the low side power device and the high side sense signal indicating when voltage changes across the high side power device; wherein the sensing circuitry includes:
   low side sensing circuitry for providing the low side sense signal; and
   high side sensing circuitry for providing the high side sense signal;
   the low and high side sensing circuitry including low and high side sense input pins, respectively, for receiving sense input signals from the low and high side power devices, respectively, each sense input signal including information about voltage across the respective power device;
   wherein each of the power devices has a respective power supply lead and a respective ground lead, the sense input signal for each power device indicating voltage at the respective power supply lead,
   each of the low and high side sensing circuitry including a respective comparator with first and second inputs, the first input for receiving the respective sense input signal and the second input for receiving a reference voltage relative to the respective round lead, the comparator providing a result signal indicating whether the sense input signal is greater than the reference voltage, the result signal including a transition between low and high values when voltage changes across the respective power device.

5. The integrated circuit of claim 4 wherein each of the low and high side power devices has a respective gate lead for receiving signals to turn the device on and off, the integrated circuit further including:

low and high side driving circuitry for the low and high side power devices, respectively, each of the low and high side driving circuitry including a respective driver for providing an output drive signal in response to a respective input drive signal indicating whether to turn on or off the respective device and a driver output pin for connecting to provide the output drive signal to the respective power device's gate lead; and low and high side shutdown circuitry, each causing the respective low or high side driver to turn off the respective power device if the power device is turned on when the result signal from the respective comparator indicates that the sense input signal is greater than the reference voltage.

6. The integrated circuit of claim 5 wherein each input drive signal is derived from a pulse width modulated drive signal, each of the low and high side driving circuitry including a respective driver input pin for connecting to receive the respective input drive signal, the high side driving circuitry further including level shift up circuitry that shifts the high side input drive signal to a high side voltage range.

7. A power control circuit that includes a voltage feedback circuit for low side and high side power devices arranged in a half-bridge configuration for providing an output power signal, the output power signal depending on voltages across the low and high side power devices, the voltage feedback circuit comprising:

sensing circuitry that senses voltage changes across the low and high side power devices; the sensing circuitry providing low and high side sense signals, the low side sense signal indicating when voltage changes across the low side power device and the high side sense signal indicating when voltage changes across the high side power device;

each of the low and high side power devices having a respective gate lead for receiving signals to turn the device on and off, each of the low and high side sense signals indicating whether voltage across the respective power device is greater than a reference voltage; the power control circuit further including:

low and high side driving circuitry for the low and high side power devices, respectively, each of the low and high side driving circuitry being connected to provide a respective output drive signal to the respective power device gate lead; and low and high side shutdown circuitry, each causing the respective low or high side driver to turn off the respective power device if the power device is turned on when the respective low or high side sense signal indicates that voltage across the respective power device is greater than the reference voltage.

8. The power control circuit of claim 7 wherein each of the low and high side driving circuitry includes a respective driver that provides the output drive signal in response to a respective input drive signal indicating whether to turn on or off the respective power device, each of the low and high side shutdown circuitry receiving the respective low or high side sense signal from the respective sensing circuitry and the respective input drive signal and, if the sense signal and the input drive signal indicate that the respective power device is turned on when the voltage across the respective power device is greater than the reference voltage, causing the respective driver to turn off the respective power device.

9. A voltage feedback circuit for low side and high side power devices arranged in a half-bridge configuration for providing an output power signal, the output power signal depending on voltages across the low and high side power devices, the voltage feedback circuit comprising:

sensing circuitry that senses voltage changes across the low and high side power devices; the sensing circuitry providing low and high side sense signals, the low side sense signal indicating when voltage changes across the low side power device and the high side sense signal indicating when voltage changes across the high side power device; and feedback signal circuitry for receiving the low and high side sense signals and, in response, providing first and second feedback signals obtained respectively from the low and high side sense signals, the feedback signal circuitry including level shilling circuitry that shills at least one of the high and low side sense signals to obtain the first and second feedback signals in approximately the same voltage range.

10. The circuit of claim 9 in which the level shifting circuitry shifts only the high side sense signal to obtain the second feedback signal.

11. An integrated circuit that includes the voltage feedback circuit of claim 9, the feedback signal circuitry including low and high side feedback output pins for connecting to provide the first and second feedback signals.

12. A power control circuit for controlling a power device that provides an output power signal, the output power signal depending on voltage across the power device, the power device having a gate lead for receiving signals to turn the power device on and off, the power control circuit comprising:

driving circuitry that provides output drive signals to the power device's gate lead;

sensing circuitry for providing a sense result signal indicating whether voltage across the power device is greater than a reference voltage;

feedback signal circuitry for receiving the sense result signal and, in response, providing a voltage feedback signal indicating when voltage changes across the power device; and shutdown circuitry for receiving the sense result signal and causing the driving circuitry to turn off the power device if the power device is turned on when the sense result signal indicates that voltage across the power device is greater than the reference voltage.

13. An integrated circuit that includes the power control circuit of claim 12, the power device having a power supply lead and a ground lead, the sensing circuitry including:

a sense input pin for receiving a sense input signal indicating voltage at the power supply lead; and a comparator with first and second inputs, the first input receiving the sense input signal from the sense input pin and the second input receiving the reference voltage relative to the ground lead, the comparator providing the sense result signal.

14. The integrated circuit of claim 13 wherein the driving circuitry includes:

a driver for providing the output drive signals in response to the shutdown circuitry and in response to an input drive signal indicating whether to turn on or off the power device, the driver providing the output drive signals in accordance with the input drive signal except when the shutdown circuitry causes the driver to turn off the power device; and a driver output pin for connecting to provide the output drive signals to the gate lead.

15. A power control circuit for low and high side power devices that provide an output power signal, the output power signal depending on voltages across the low and high side power devices, each of the power devices having a respective gate lead for receiving signals to turn the power device on and off, the power control circuit comprising:

driving circuitry for providing low and high side output drive signals for the gate leads of the low and high side power devices, respectively;

sensing circuitry for sensing voltage changes across the low and high side power devices, the sensing circuitry providing low and high side sense signals indicating respectively whether voltage across the low or high side power device is greater than a respective reference voltage;

feedback signal circuitry for receiving the low and high side sense signals and, in response, providing voltage feedback signals indicating when voltages change across the low and high side power devices; and shutdown circuitry for receiving the low and high side sense signals and causing the driving circuitry to turn off the low or high side power device if the power device is turned on when the respective sense result signal indicates that voltage across the power device is greater than the respective reference voltage.

16. The circuit of claim 15 wherein the low and high side power devices can be separately turned on and off to control the voltages across them, on times of the low and high side power devices being separated by a deadtime that begins when one of the devices is turned off and ends when the other is turned on; one of the low and high side sense signals indicating a beginning of the deadtime and the other indicating an ending of the deadtime; the voltage feedback signals indicating the beginning and ending of the deadtime.

17. The circuit of claim 15 wherein the driving circuitry includes low and high side driving circuitry for the low and high side power devices, respectively, each of the low and high side driving circuitry providing the respective output drive signal to the respective power device's gate lead; each of the low and high side driving circuitry including:

a respective driver for providing the respective output drive signal in response to the shutdown circuitry and in response to a respective input drive signal indicating whether to turn on or off the respective power device, the driver providing the respective output drive signal in accordance with the respective input drive signal except when the shutdown circuitry causes the driver to turn off the power device.

18. An integrated circuit that includes the power control circuit of claim 15, the sensing circuitry including:

low side sensing circuitry that provides the low side sense signal; and high side sensing circuitry that provides the high side sense signal;

the low and high side sensing circuitry including low and high side sense input pins, respectively, for receiving sense input signals from the low and high side power devices, respectively, each sense input signal including information about voltage across the respective power device.

19. An integrated circuit that includes the power control circuit of claim 15, the feedback signal circuitry including low and high side feedback output pins for connecting to provide low and high side voltage feedback signals, respectively indicating when voltage across the respective power device changes between less than and greater than the respective reference voltage.

20. The circuit of claim 15 wherein the voltage feedback signals include first and second feedback signals obtained respectively from the low and high side sense signals, the feedback signal circuitry including level shifting circuitry that shifts at least one of the high and low side sense signals to obtain the first and second feedback signals in approximately the same voltage range.

* * * * *

UNITED STATES PATENT AND TRADEMARK OFFICE
CERTIFICATE OF CORRECTION

PATENT NO.    : 6,580,627 B2
DATED         : June 17, 2003
INVENTOR(S)   : Toshio Takahashi It is certified that error appears in the above-identified patent and that said Letters Patent is hereby corrected as shown below:

<u>Title page,</u>
Item [75], should read
-- [75]  Inventor:  Toshio Takahashi, Rancho Palos Verdes, CA (US) --

Signed and Sealed this

Twenty-first Day of October, 2003

JAMES E. ROGAN
*Director of the United States Patent and Trademark Office*